United States Patent
Carroll et al.

(10) Patent No.: US 6,320,468 B2
(45) Date of Patent: *Nov. 20, 2001

(54) METHOD AND SYSTEM FOR SUPPRESSING OSCILLATIONS IN A MULTI-STAGE AMPLIFIER

(75) Inventors: James M. Carroll; John G. Heston, both of Dallas, TX (US)

(73) Assignee: Raytheon Company, Lexington, MA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/178,166

(22) Filed: Oct. 23, 1998

(51) Int. Cl.[7] .............. H03F 3/60; H03F 3/16; H03F 3/04; H01P 1/20; H01P 7/00
(52) U.S. Cl. .............. 330/286; 330/277; 330/310; 333/202; 333/219
(58) Field of Search .............. 330/277, 286, 330/302, 310, 290, 98, 99, 100, 307; 333/202, 219

(56) References Cited

U.S. PATENT DOCUMENTS

| | | | | |
|---|---|---|---|---|
| 4,338,582 | * | 7/1982 | Presser | 333/175 |
| 4,532,480 | * | 7/1985 | Gerard | 330/286 |
| 4,551,780 | * | 11/1985 | Canay | 333/175 |
| 4,947,136 | * | 8/1990 | Helms | 330/277 |
| 5,406,235 | * | 4/1995 | Hayashi | 333/204 |
| 5,465,417 | * | 11/1995 | Tanbakuchi | 333/235 |
| 5,553,319 | * | 9/1996 | Tanbakuchi | 333/202 |
| 5,574,402 | * | 11/1996 | Nakajima et al. | 330/286 |
| 6,134,117 | * | 10/2000 | Funk et al. | 361/760 |

* cited by examiner

*Primary Examiner*—Robert Pascal
*Assistant Examiner*—Patricia Nguyen
(74) *Attorney, Agent, or Firm*—Baker Botts L.L.P.

(57) ABSTRACT

A multi-stage amplifier for amplifying radio frequency signals includes a first amplifier stage having a first transistor and a second amplifier stage having a second transistor. The first transistor includes a first drain connected to a reference voltage through a first connection circuit. The second transistor includes a second drain connected to a reference voltage through a second connection circuit. The amplifier also includes a first transmission line connecting a portion of the first connection circuit to a portion of the second connection circuit and a resistive element connected in parallel with the first transmission line between the portion of the first connection circuit and the portion of the second connection circuit. The resistive element suppresses oscillation conditions at either of the first and second bias terminals.

26 Claims, 3 Drawing Sheets

METHOD AND SYSTEM FOR SUPPRESSING OSCILLATIONS IN A MULTI-STAGE AMPLIFIER

TECHNICAL FIELD OF THE INVENTION

This invention relates generally to amplifiers and more particularly to a method and system for suppressing crosstalk in a multi-stage amplifier.

BACKGROUND OF THE INVENTION

Amplifiers are used in the electronic industry for a variety of purposes. One common type of amplifier is a multi-stage amplifier in which a plurality of amplifier stages are connected together to provide desired levels of amplification. In one type of multi-stage amplifier, a field-effect transistor is provided in each stage. The field-effect transistor provides the amplifying effect of an input signal, and the amplified signal is provided as an input signal to the next stage. An example of such an amplifier is a monolithic microwave integrated circuit, which is particularly designed to amplify radio and microwave signals.

Such amplifiers often use a single bias pad connecting all gates or all drains of the field-effect transistors of each stage of the amplifier. The use of a single bias pad allows biasing of the gates or drains in each amplifier stage with a single applied voltage. In such amplifiers, both the gates and the drains are connected to ground through a bypass capacitor. The bypass capacitor is provided as a path for high frequency signals from ground to flow to ground in order to suppress transmission of the high frequency signals along the bias pad to adjacent amplifier stages. The bypass capacitor, however, blocks lower frequency signals from ground and allows lower frequency signals to be transmitted along the bias pad, such as a bias voltage. The bias pad is often implemented by connecting each stage's bypass capacitors together with microstrip lines to form a bias bus.

A problem with the use of such microstrip lines is that they form a resonant structure with the bypass capacitors. At resonance, this structure provides a low loss feedback path for signals into the gate or drain of the field-effect transistors, allowing crosstalk between the respective transistor terminals. This resonance creates a potential gain loop which often causes oscillation problems for the entire amplifier. The resonance also causes the impedance at the bypass capacitors to resonate from a short circuit to an open circuit (or large impedance). High impedances at low frequencies typically cause oscillations in microwave transistors. Prior methods for suppressing such effects of the gain loop are either space prohibitive or adversely affect the amplifier's output power and efficiency.

SUMMARY OF THE INVENTION

Accordingly, a need has arisen for an improved method and system for suppressing feedback in a multi-stage amplifier. The present invention provides a method and system for suppressing feedback in a multi-stage amplifier that addresses shortcomings of prior systems and methods.

According to one embodiment of the invention, a multi-stage amplifier for amplifying radio frequency signals includes a first amplifier stage having a first transistor and a second amplifier stage having a second transistor. The first transistor includes a first drain connected to a reference voltage through a first connection circuit, and the second transistor includes a second drain connected to the reference voltage through a second connection circuit. The amplifier also includes a first transmission line connecting a portion of the first connection circuit to a portion of the second connection circuit and a resistive element connected in parallel with the first transmission line between the portion of the first connection circuit and the portion of the second connection circuit. The resistive element suppresses the radio frequency signals from being transmitted between the first and second drains.

According to another embodiment of the invention, a method for suppressing radio frequency transmission between a first stage and a second stage of an amplifier includes connecting a first node of a first transistor in the first stage to a corresponding second node of a second transistor in the second stage with a transmission line. The method also includes placing a resistive element in parallel with the transmission line.

Embodiments of the invention provide numerous technical advantages. For example, in one embodiment of the invention, an amplifier is provided that suppresses a gain loop in gate and drain biased lines. This is accomplished without the need for radio frequency traps, series resistors, or other methods that adversely affect the amplifier's output power and efficiency. Embodiments of the invention are also inherently broad-band and do not contribute to lower drain efficiencies due to resistors placed serially in the biased lines. Furthermore, according to one embodiment of the invention, gain loop suppression may be effected by modifying standard bias bus microstrip lines. Thus, the present invention can be fabricated at little or no additional expense.

Other technical advantages are readily apparent to one skilled in the art from the following figures, descriptions, and claims.

BRIEF DESCRIPTION OF THE DRAWINGS

For a more complete understanding of the present invention and the advantages thereof, reference is now made to the following descriptions taken in connection with the accompanying drawings in which.

DETAILED DESCRIPTION OF THE INVENTION

The present invention and its advantages are best understood by referring to FIGS. 1 through 6 of the drawings, like numerals being used for like and corresponding parts of the various drawings.

Figure 1:
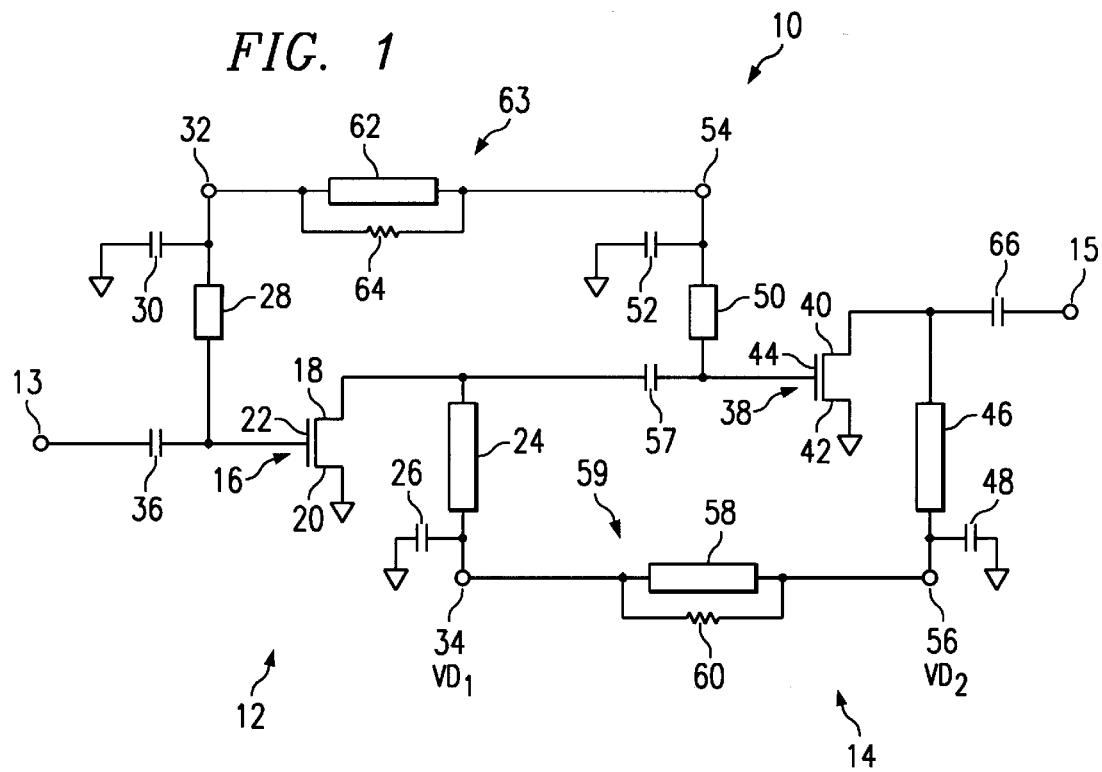
FIG. 1 is a schematic diagram of a multi-stage amplifier according to the teachings of the present invention.

FIG. 1 is a schematic diagram of a multi-stage amplifier 10 according to the teachings of the present invention. In the illustrated embodiment, multi-stage amplifier 10 includes two stages; however, any suitable number of stages may be used. Multi-stage amplifier 10 includes a first stage 12 and a second stage 14. Stages 12 and 14 are substantially similar. Multi-stage amplifier 10 includes an input node 13 for receiving a signal to be amplified and an output node 15 for providing the amplified signal.

Stage 12 includes a field-effect transistor 16. The invention is described in the context of amplifiers implemented using field-effect transistors; however, the teachings of the invention may be incorporated to suppress oscillation conditions at bias terminals of any suitable type of transistor, including bipolar junction transistors. A bias terminal is a terminal of a transistor that receives a bias voltage to control the operation of the transistor. Field-effect transistor 16 has a drain 18, a source 20, and a gate 22. Connected to drain 18 is a transmission line 24. Disposed between transmission line 24 and a ground reference is a bypass capacitor 26. Bypass capacitor 26 prevents high frequency signals, such as radio frequency signals, from flowing from drain 18 to second stage 14, but allows low frequency signals to flow to second stage 14, as described in greater detail below.

Source 20 of field effect transistor 16 is connected to a ground reference. Gate 22 of field-effect transistor 16 is connected by a transmission line 28 to a ground reference through a second bypass capacitor 30. Bypass capacitor 30 performs the same function as bypass capacitor 26 but is associated with gate 22 rather than drain 18. A node 32 is located between transmission line 62 and bypass capacitor 30. A node 34 is located between transmission line 58 and capacitor 26. Node 32 provides a location at which a bias voltage may be applied to bias gate 22. Node 34 provides a location at which a bias voltage may be applied to bias drain 18. Bias voltages are applied at nodes 32 and 34 to control the level of amplification provided by field-effect transistor 16 in stage 12. An input capacitor 36 connected to input node 13 blocks DC signals from exiting the amplifier through node 13. An output capacitor 57 blocks DC signals at drain 18 from being transmitted to stage 14.

Stage 14 is substantially similar to stage 12 and includes a field-effect transistor 38 having a drain 40, a source 42, and a gate 44. Drain 40 is connected to a ground reference through a transmission line 46 and a bypass capacitor 48. A node 56 is located between transmission line 58 and bypass capacitor 48. Gate 44 is connected to a ground reference through a transmission line 50 and a bypass capacitor 52. A node 54 is located between transmission line 62 and bypass capacitor 52. The output of stage 14 is provided at output node 15 which is DC isolated with capacitor 66. The operation of transistor 38, and therefore stage 14, is affected by voltages applied to gate 44 and drain 40. These voltages are applied to nodes 54 and 56, respectively.

To facilitate control of each stage of amplifier 10, nodes 34 and 56 are connected with a transmission line 58 to form a drain bias bus 59. Drain bias bus acts as a single node at which a drain bias voltage may be applied to all drains within amplifier 10. In this example, the use of drain bias bus 59 allows application of a bias voltage to drains 18 and 40. A resistor 60 connected in parallel with transmission line 58 is described in greater detail below.

The gate bias voltages of each field-effect transistor 16, 38 may also be similarly controlled by the use of a gate bias bus 63. For example, a transmission line 62 connects nodes 32 and 54, forming gate bias bus 63. Therefore, the gate bias voltages for each stage 12, 14 may be controlled by the application of a single voltage along gate bias bus 63. A resistor 64 connected in parallel with transmission line 62 is described in greater detail below.

However, the use of a bias bus is not without its disadvantages. For example, such use allows high frequency signals to be transmitted between the drains or between the gates of each stage. Such transmission is generally not desirable. For example, the combination of bypass capacitors 26 and 48 with transmission line 58 will create a resonance, which may create oscillation problems for amplifier 10. An example of the creation of a resonance is illustrated in FIG. 2.

Figure 2:
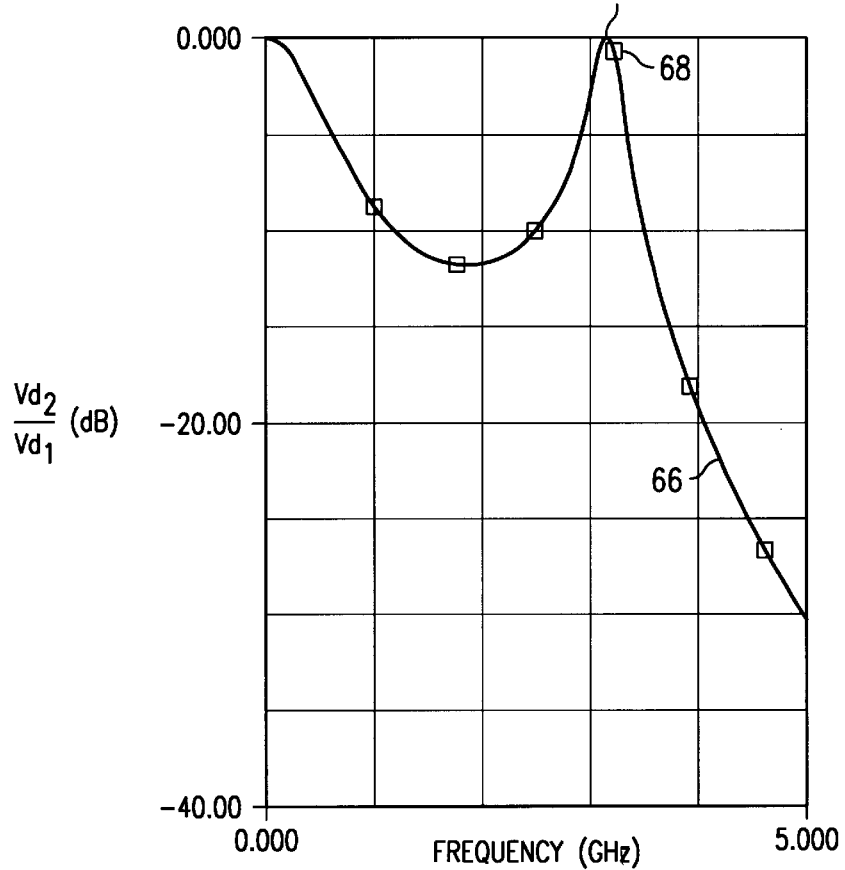
FIG. 2 is a graph illustrating voltage attenuation between two drains of a conventional two-stage amplifier.

FIG. 2 is a graph illustrating voltage attenuation between two drains of a conventional two-stage amplifier utilizing drain bias bus. The horizontal axis of the graph shows input signal frequency for the amplifier. A curve 66 in FIG. 2 shows the ratio of drain voltages between a second stage and a first stage of an amplifier for various signal frequencies, measured in dB. As illustrated, at a zero frequency, the attenuation between the two drains is zero, which means that the voltages at each drain are the same. As the input signal frequency increases, the ratio of voltages decreases, and therefore the amount of attenuation increases, to a local minimum of approximately −12 dB. However, the ratio increases after that point for increasing frequency and reaches a local maximum of zero at a resonant frequency of approximately 3.1 Gigahertz. This lack of attenuation of high frequency signals is undesirable for two reasons. First, it causes a gain loop between nodes 34 and 56 with little or no attenuation. Secondly, both nodes 34 and 56 resonate to an open circuit which generally is an unstable condition for microwave transistors, especially on their drains below 5 GHz in frequency. At frequencies above this resonant frequency of 3.1 Gigahertz, as the frequency of the input signal to the amplifier increases, the ratio between voltages decreases.

In order to combat this lack of attenuation and potential gain loop, a resistor 60 is provided in parallel with transmission line 58, as illustrated in FIG. 1. Providing a resistor 60 in parallel with transmission line 58 reduces the amount of feedback between nodes 56 and 34 and results in greater attenuation between nodes 56 and 34, which as described above is desirable. The greater attenuation can be attributed to the provision of a real impedance component to the combination of transmission line 58 and resistor 60. The resistive component also lowers the impedance value at nodes 34 and 56 to a usually more stable value. Traditional attempts at addressing this problem have utilized a resistor in series with transmission line 58, which has a disadvantage of large DC power loss. It is believed that such a combination provides attenuation between nodes 56 and 34 due to losses associated with current flow through the series resistor. The use of a resistance in parallel for attenuation purposes therefore appears counterintuitive to one of ordinary skill since the combination of two elements in parallel generally provides a lesser resistance than the resistance provided by only one of the elements.

The teachings of the invention, however, recognize that placing a resistance element in parallel can reduce crosstalk between nodes of adjacent stages. Because transmission line 58 can be modeled fairly accurately as an inductor, transmission line 58 contributes primarily to an imaginary component of the impedance of the combination of transmission line 58 and resistor 60. Resistor 60 provides a real component to this impedance value. The addition of the real component of this impedance value results in desirable attenuation effects and the prevention of crosstalk between nodes 56 and 34 for radio frequency signals. At low frequencies, transmission line 58, which can be modeled as an inductor, acts as a short and allows current to flow without significant losses. However, at high frequencies transmission line 58 provides a higher impedance, and therefore current flows through resistor 60, which creates desirable losses that attenuate crosstalk between nodes 34 and 56 at high frequencies. Incorporation of resistor 64 in parallel with transmission line 62 operates similarly for gate bias voltages.

Although the invention is useful for allowing the use of gate bias bus 63 and drain bias bus 59, the invention recognizes that the beneficial effects of the use of a resistor in parallel with a transmission line are most greatly seen when used with the drain bias bus 59. Because the magnitude of the current flowing through transmission line 62 is relatively small, a resistor could be placed in series with transmission line 60 to address the feedback problem. Such resistor would not provide a great loss in power because of the low current value through the series resistor. In contrast, however, the currents flowing from node 34 to node 56 at DC frequencies are relatively large and placing a resistor in series with transmission 58 would result in significant power loss.

The use of resistor 60 in parallel with transmission line 58 therefore attenuates high frequency crosstalk between drains of a multi-stage amplifier. This goal is achieved without significant power consumption because, at low frequencies, transmission line 58, which may be modeled as an inductor, acts as a short and allows current to flow between the nodes resulting in little power loss. However, at high frequencies, current flows through resistor 60, providing attenuation.

Figure 3:
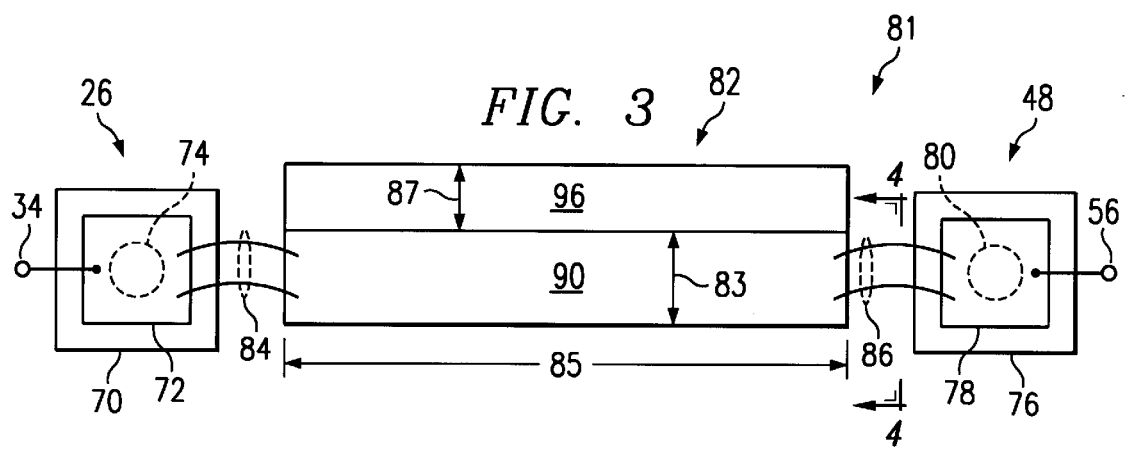
FIG. 3 is a top view of one embodiment of an attenuation line for connecting two bypass capacitors in the multi-stage amplifier of FIG. 1.

Although any suitable combination of transmission line 58 with a parallel resistor 60 could be used to achieve the benefits of the present invention, a particular type of high frequency signal attenuation line 82 that introduces a real component of impedance is illustrated in FIG. 3.

FIG. 3 is a top view of a circuit 81 showing the connection of bypass capacitors 26 and 48 of FIG. 1 by a high frequency signal attenuation line 82. As illustrated, capacitor 26 includes a bottom plate 70 and a top plate 72. Bottom plate 70 is connected to ground through a via 74. Bypass capacitor 48 is similar to bypass capacitor 26 and includes a bottom plate 76 and a top plate 78. Bottom plate 76 is connected to ground through a via 80. Top plate 72 of capacitor 26 is connected to radio frequency signal attenuation line 82 through an airbridge 84. Top plate 78 of capacitor 48 is connected to radio frequency signal attenuation line 82 through an airbridge 86. High frequency signal attenuation line 82 includes the above-described real component of impedance and may be used to effect the parallel combination of transmission line 58 and parallel resistor 60 and provides desirable attenuation properties.

High frequency signal attenuation line 82 has a length 85 and includes a first portion 90 and a second portion 96. First portion 90 has a width 83, and second portion 96 has a width 87. Radio frequency signal attenuation line 82 is also illustrated in FIG. 4.

Figure 4:
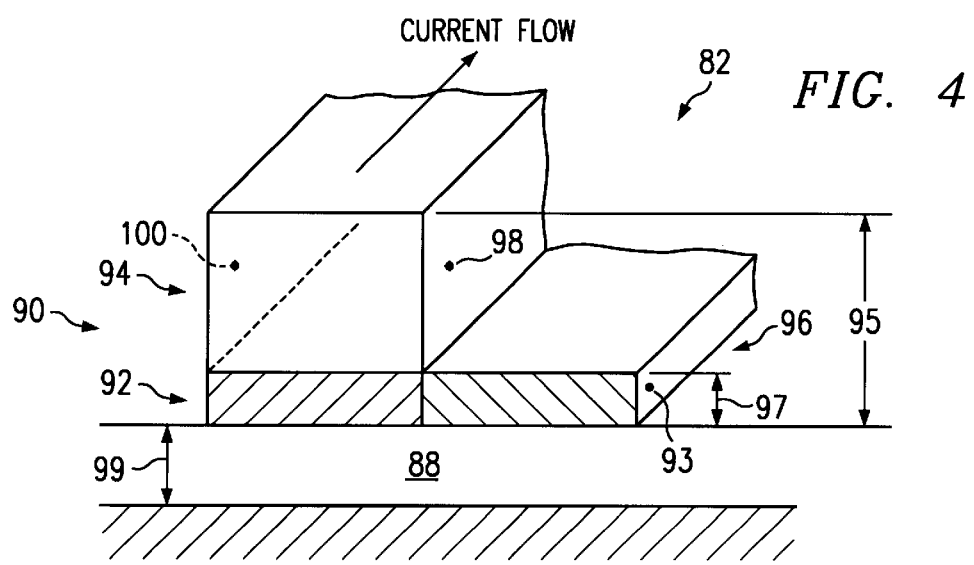
FIG. 4 is an end view of the attenuation line of FIG. 3 taken along the lines 4—4 of FIG. 3.

FIG. 4 is an end view of high frequency signal attenuation line 82 illustrated in FIG. 3 taken along the lines 4—4 of FIG. 3. As illustrated, high frequency signal attention line 82 includes a base 88. In one embodiment of the invention, base 88 is formed from Gallium Arsenide and has a thickness 99 of 100 micrometers. Base 88 forms the substrate from which line 90 forms a microstrip transmission line which conducts signals between capacitors 26 and 48. Within first portion 90, layer 92 formed from a resistive material is disposed over base 88. In one embodiment of the invention, layer 92 is an adhesion alloy including titanium, platinum, chrome, and gold; however, other suitable types of materials may be used. Layer 92 is used to attach metal layer 94 to base 88. Adhesion layer 92 is resistive, providing some real resistance to current flow. Metal layer 94 of first portion 92 provides a main path for conduction of electricity along length 85 of high frequency signal attenuation line 82. In one embodiment, second portion 94 is formed from gold. First portion 90, which includes the portion of base 88 underlying layer 92, constitutes a transmission line, such as transmission line 58 illustrated in FIG. 1. To provide a parallel resistive component, layer 93 of a resistive material is disposed overlying base 88 and adjacent layer 92. In the illustrated embodiment, layers 92 and 93 are formed of the same material and are integral with each other; however, they may be found separately and from separate materials.

High frequency signal attenuation line 82 may be formed by preparing a standard microstrip line having an adhesive layer having a width greater than the width of an associated gold layer. Layer 93 of second portion 96 provides a resistance to current flow, and therefore second portion 96 constitutes a resistor in parallel with a transmission line. In the illustrated embodiment, layers 92 and 93 have the same height, which in one embodiment is 0.4 micrometers. Portion 94 has a height 95, which in the same embodiment is 5 micrometers.

First portion 90 also includes a first side 98 that is adjacent layer 93 and a second side 100 that is not adjacent layer 93. In addition to providing a resistance in parallel with a transmission line, the illustrated embodiment also reduces crosstalk between capacitors 26 and 48 by locating a resistive material adjacent edge 98 of first portion 96. In the absence of second portion 96, the current density flowing through first portion 90 is believed to be greatest at edges 100 and 98. However, with the addition of a resistive layer 93 adjacent side 98, the current density is reduced at side 98 and is greatest at sides 100 and 96. Therefore, where current density was greatest, a resistive material has been applied, which provides greater attenuation to high frequency signals. Results of the use of various embodiments of the invention are described in greater detail below in conjunction with FIG. 5.

Figure 5:
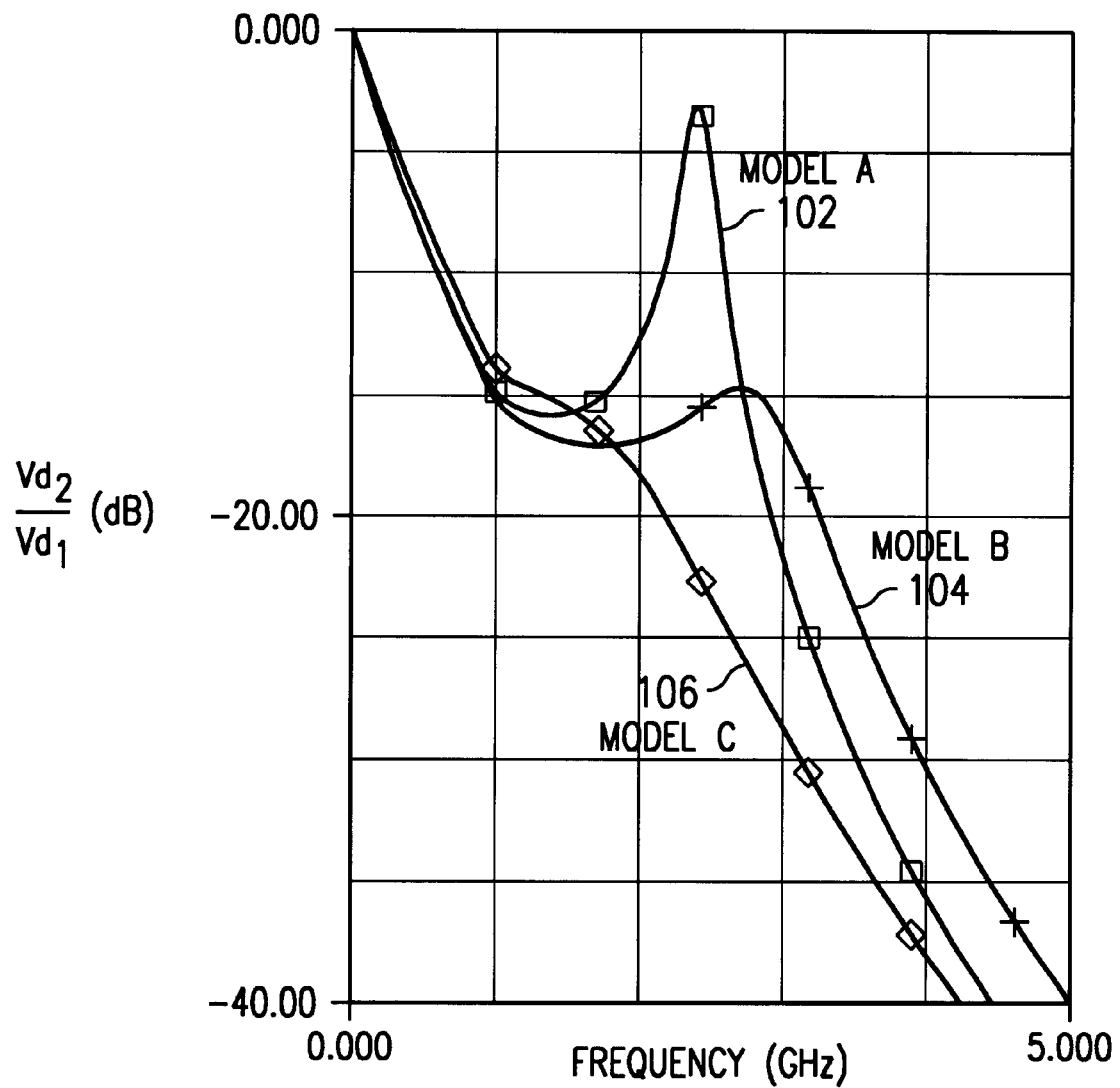
FIG. 5 is a graph illustrating voltage attenuation between the drains of field-effect transistors in two adjacent stages of a multi-stage amplifier for various configurations.

FIG. 5 is a graph illustrating voltage attenuation between the drains of field effect transistors in two adjacent stages of various embodiments of a multi-stage amplifier. Curve 102 illustrates the attenuation between nodes 56 and 34 of FIG. 1 in the absence of parallel resistor 60. Curve 104 illustrates the attenuation between the same nodes, with resistor 60 added in parallel with transmission line 58. Curve 106 illustrates the attenuation between the same nodes resulting from the addition of resistor 60 in parallel with transmission line 58, but with a transmission line 58 having a length three times that of the one used for curve 104. The length of transmission line 58 directly affects its inductance. As shown, the inductance of transmission line 58 and resistance of resistor 60 placed in parallel with transmission line 58 can be selected based on a desired attenuation response. For the above examples, resistor 60 has a value of 7 ohms; transmission line 58 has a width of 100 $\mu$m and a length of 1000 $\mu$m, and bypass capacitors 26 and 48 have capacitance values of 20 pF.

Figure 6:
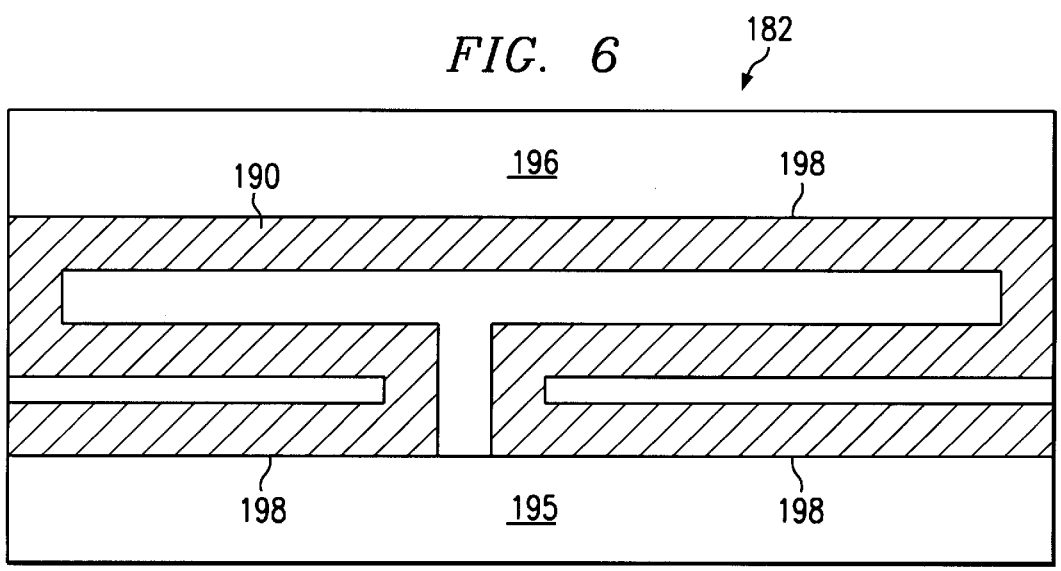
FIG. 6 is a top view of an alternative embodiment of an attenuation line for connecting two bypass capacitors in the multi-stage amplifier of FIG. 1.

FIG. 6 is an alternative embodiment 182 for high frequency signal attention line 82. As illustrated in FIG. 5, the response between nodes 34 and 56 may be tailored by appropriately selecting the length of transmission line 58 as well as the resistance of resistor 60. An example embodiment for effecting such tailoring is illustrated in FIG. 6. FIG. 6 includes an elongated transmission line 190 with resistive layers 195 and 196 adjacent edges 198 of transmission line 190. Transmission line 190 is substantially similar to transmission line 90, except for its elongated and serpentined configuration. Resistive layers 195 and 196 are substantially similar to resistor layer 93. The effective electrical length of transmission line 190 is increased by providing it in a serpentined configuration. Such a configuration allows an increase in the inductance of transmission line 190, but allow transmission line 190 to fit between capacitors 26 and 48 without adjusting the location of capacitors 26 and 48. Thus, an increased conductance for transmission line 190 may be provided, while at the same time benefiting from locating a resistance in parallel with transmission line 190. Furthermore, the parallel resistance in FIG. 6 is located along edges 198 of transmission line 190, which conventionally would carry the highest current density within transmission line 190, further increasing the attenuation of line 182.

The invention therefore provides an amplifier that suppresses a gain loop in gate and drain biased lines. This is accomplished without the need for radio frequency traps, series resistors, or other methods that adversely affect the amplifier's power efficiency. Embodiments of the invention are also inherently broad-band and do not contribute to lower drain efficiencies due to resistors placed serially in the biased lines. Furthermore, according to one embodiment of the invention, gain loop suppression may be effected by modifying standard bias bus microstrip lines. Thus, the present invention can be fabricated at little or no additional expense.

Although the present invention and its advantages have been described in detail, it should be understood that various changes, substitutions, and alterations can be made therein without departing from the spirit and scope of the present invention as defined by the appended claims.

What is claimed is:

1. A multi-stage amplifier for amplifying radio frequency signals, the amplifier comprising:
    a first amplifier stage having a first transistor, the first transistor having a first bias terminal connected to a reference voltage through a first connection circuit;
    a second amplifier stage having a second transistor, the second transistor having a second bias terminal connected to a reference voltage through a second connection circuit;
    a first transmission line connecting a portion of the first connection circuit to a portion of the second connection circuit; and
    a resistive element connected in parallel with the first transmission line between the portion of the first connection circuit and the portion of the second connection circuit for suppressing oscillation conditions at either of the first and second bias terminals;
    wherein the first connection circuit includes a second transmission line connected serially to a first bypass capacitor at a first node;
    wherein the second connection circuit includes a third transmission line connected serially to a second bypass capacitor at a second node;
    wherein the first transmission line connects the first and second nodes; and
    wherein the resistive element is connected in parallel with the first transmission line between the first and second nodes.

2. The amplifier of claim 1, wherein the resistive element has a resistance of five to ten ohms.

3. The amplifier of claim 1, wherein the resistive element has a resistance small enough to attenuate unwanted signals at a resonant frequency.

4. The amplifier of claim 1, wherein the resistive element in combination with the first transmission line provides an attenuation between the first node and the second node, the level of attenuation increasing with increasing frequency of the radio frequency signal for all frequencies less than 5 Gigahertz.

5. A multi-stage amplifier for amplifying radio frequency signals, the amplifier comprising:
    a first amplifier stage having a first transistor, the first transistor having a first bias terminal connected to a reference voltage through a first connection circuit;
    a second amplifier stage having a second transistor, the second transistor having a second bias terminal connected to a reference voltage through a second connection circuit;
    a transmission line connecting a portion of the first connection circuit to a portion of the second connection circuit; and
    a resistive element connected in parallel with the transmission line between the portion of the first connection circuit and the portion of the second connection circuit for suppressing oscillation conditions at either of the first and second bias terminals;
    wherein the transmission line is formed in a serpentine configuration.

6. A multi-stage amplifier for amplifying radio frequency signals, the amplifier comprising:
    a first amplifier stage having a first transistor, the first transistor having a first bias terminal connected to a reference voltage through a first connection circuit;
    a second amplifier stage having a second transistor, the second transistor having a second bias terminal connected to a reference voltage through a second connection circuit;
    a transmission line connecting a portion of the first connection circuit to a portion of the second connection circuit; and
    a resistive element connected in parallel with the transmission line between the portion of the first connection circuit and the portion of the second connection circuit for suppressing oscillation conditions at either of the first and second bias terminals;
    wherein the first bias terminal is a gate.

7. A method for suppressing transmissions of a signal between a first stage and a second stage of an amplifier, the method comprising:
    connecting a first node of a first transistor in the first stage to a corresponding second node of a second transistor in the second stage with a transmission line; and
    placing a resistive element in parallel with the transmission line;
    wherein the first node is a gate and the second node is a gate.

8. An apparatus comprising a circuit, said circuit including:
    a first portion having a transmission line with first and second ends, and having first and second circuit components which are respectively coupled to said first and second ends of said transmission line, said first and second circuit components being capable of resonant oscillation through said transmission line; and
    a second portion which is operable to attenuate resonant oscillation between said first and second circuit components through said transmission line, said second portion including a resistance which is coupled in parallel with said transmission line between said first and second circuit components.

9. An apparatus according to claim 8, wherein said first circuit component is a first capacitor having a first end coupled to said first end of said transmission line, and having a second end coupled to a reference potential; and wherein said second component is a second capacitor having a first end coupled to said second end of said transmission line, and having a second end coupled to reference potential.

10. An apparatus according to claim 9, including a power source coupled to one of said first and second ends of said transmission line for supplying a DC voltage thereto.

11. An apparatus according to claim 9, wherein said circuit includes a high-frequency amplifier having first and second stages which respectively include first and second transistors, said first transistor having a terminal which is coupled to said first end of said transmission line, and said second transistor having a terminal which is coupled to said second end of said transmission line.

12. An apparatus according to claim 11, wherein said terminals of said first and second transistors are each coupled to a respective end of said transmission line through a respective further transmission line.

13. An apparatus according to claim 12, including a power source coupled to one of said first and second ends of said transmission line for supplying a DC voltage thereto.

14. An apparatus according to claim 11, wherein said first and second transistors are each a field effect transistor, and wherein said terminals of each of said first and second transistors are each one of a drain and a gate thereof.

15. A method for attenuating resonant oscillation between first and second circuit components which are each coupled to a respective end of a transmission line, comprising the step of coupling a resistance in parallel with said transmission line between said first and second circuit components.

16. A method according to claim 15, including the steps of:
selecting as said first circuit component a first capacitor having a first end coupled to said first end of said transmission line and having a second end coupled to a reference potential; and
selecting as said second circuit component a second capacitor having a first end coupled to said second end of said transmission line and having a second end coupled to a reference potential.

17. A method according to claim 16, including the step of supplying a DC voltage to one of said first and second ends of said transmission line.

18. A method according to claim 16, wherein said circuit includes a high-frequency amplifier having first and second stages which respectively include first and second transistors, and including the step of coupling a respective terminal of each of said transistors to a respective end of said transmission line through a respective further transmission line.

19. An apparatus comprising an integrated circuit, said integrated circuit including:
an elongate first strip which is made of a conductive material, and which serves as a transmission line; and
an attenuation section for attenuating high-frequency signals flowing through said first strip, said attenuation section including an elongate second strip which is made of a resistive material, and which extends adjacent said first strip in contact therewith.

20. An apparatus according to claim 19, wherein said first strip has a width, and wherein said second strip has a width greater than said width of said first strip.

21. An apparatus according to claim 20, wherein said integrated circuit includes a base, wherein said second strip is a layer of a resistive material provided on said base, and wherein said first strip is provided on said second strip.

22. An apparatus according to claim 20, wherein said circuit includes first and second circuit components which are each coupled to a respective end of said first strip and which are capable of resonant oscillation through said first strip.

23. An apparatus according to claim 22,
wherein said circuit includes a high-frequency amplifier having first and second stages which respectively include first and second transistors, said first transistor having a terminal which is coupled to a first end of said first strip, and said second transistor having a terminal which is coupled to a second end of said first strip;
wherein said first and second circuit components are each a capacitor coupled between a respective end of said first strip and a reference potential; and
including a power source coupled to one of said first and second ends of said first strip for supplying a DC voltage thereto.

24. An apparatus according to claim 23, wherein said terminals of said first and second transistors are respectively coupled to said first and second ends of said first strip through a respective further strip, each said further strip being made of a conductive material and serving as a transmission line.

25. An apparatus according to claim 8,
wherein said apparatus includes a multi-stage amplifier for amplifying radio frequency signals, said amplifier including said first and second portions;
wherein said first portion includes a first amplifier stage having a first transistor, said first transistor having a first bias terminal connected to a reference voltage through a first connection circuit, said first connection circuit having a portion which is said first circuit component, and said first bias terminal being a gate;
wherein said first portion includes a second amplifier stage having a second transistor, said second transistor having a second bias terminal connected to a reference voltage through a second connection circuit, and said second connection circuit having a portion which is said second circuit component;
wherein said transmission line connects said portion of said first connection circuit to said portion of said second connection circuit; and
wherein said resistance is connected in parallel with said transmission line between said portion of said first connection circuit and said portion of said second connection circuit for suppressing oscillation conditions at either of said first and second bias terminals.

26. A method according to claim 15, including the steps of:
providing an amplifier having first and second stages, said first stage including a first transistor which is said first circuit component, and said second stage including a second transistor which is said second circuit component; and
configuring said transmission line to connect a first node of said first transistor in said first stage to a corresponding second node of said second transistor in said second stage, said first node being a gate and said second node being a gate.

* * * * *